(12) United States Patent
Mollat et al.

(10) Patent No.: US 8,436,635 B2
(45) Date of Patent: May 7, 2013

(54) SEMICONDUCTOR WAFER HAVING TEST MODULES INCLUDING PIN MATRIX SELECTABLE TEST DEVICES

(75) Inventors: Martin B. Mollat, McKinney, TX (US); Doug Weiser, Plano, TX (US); Fan-Chi Hou, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 561 days.

(21) Appl. No.: 12/552,215

(22) Filed: Sep. 1, 2009

(65) Prior Publication Data

US 2011/0050275 A1    Mar. 3, 2011

(51) Int. Cl.
*G01R 31/02*    (2006.01)

(52) U.S. Cl.
USPC ............. 324/762.05; 324/762.09; 324/762.01

(58) Field of Classification Search ............ 324/757.02–757.03, 762.01–763.01
See application file for complete search history.

(56) References Cited

U.S. PATENT DOCUMENTS

| | | | |
|---|---|---|---|
| 5,404,099 A * | 4/1995 | Sahara ........................ | 324/750.3 |
| 5,825,193 A * | 10/1998 | Nakata et al. ............. | 324/750.05 |
| 5,917,197 A * | 6/1999 | Alswede et al. ................ | 257/48 |
| 6,529,031 B2 | 3/2003 | Gerstmeier et al. | |
| 6,628,134 B1 * | 9/2003 | Lee .......................... | 324/762.01 |
| 6,707,064 B2 | 3/2004 | Jang et al. | |
| 6,784,685 B2 * | 8/2004 | Chao et al. ............... | 324/754.05 |
| 7,489,152 B2 * | 2/2009 | Yuan et al. ................. | 324/750.3 |
| 7,652,493 B2 * | 1/2010 | Kerber ..................... | 324/762.05 |
| 8,324,916 B2 * | 12/2012 | Hayashi ..................... | 324/750.3 |
| 2007/0075718 A1 * | 4/2007 | Hess et al. ..................... | 324/765 |
| 2010/0327893 A1 * | 12/2010 | Vilas Boas et al. ...... | 324/754.07 |

* cited by examiner

*Primary Examiner* — Joshua Benitez Rosario
(74) *Attorney, Agent, or Firm* — Jacqueline J. Garner; Wade J. Brady, III; Frederick J. Telecky, Jr.

(57) ABSTRACT

A semiconductor wafer includes a plurality of die areas including circuit elements, and at least one test module (TM) on the wafer outside the die areas. The TMs include a test circuit including plurality of test transistors arranged in a plurality of rows and columns. The plurality of test transistors include at least three terminals (G, S, D and B). The TMs each include a plurality of pads. The pads include a first plurality of locally shared first pads each coupled to respective ones of a first of the three terminals, a second plurality of locally shared second pads each coupled to respective ones of a second of the three terminals, and at least one of the plurality of pads coupled to a third of the three terminals. The TM provides at least 2 pin transistor selection for uniquely selecting from the plurality of test transistors for testing.

10 Claims, 4 Drawing Sheets

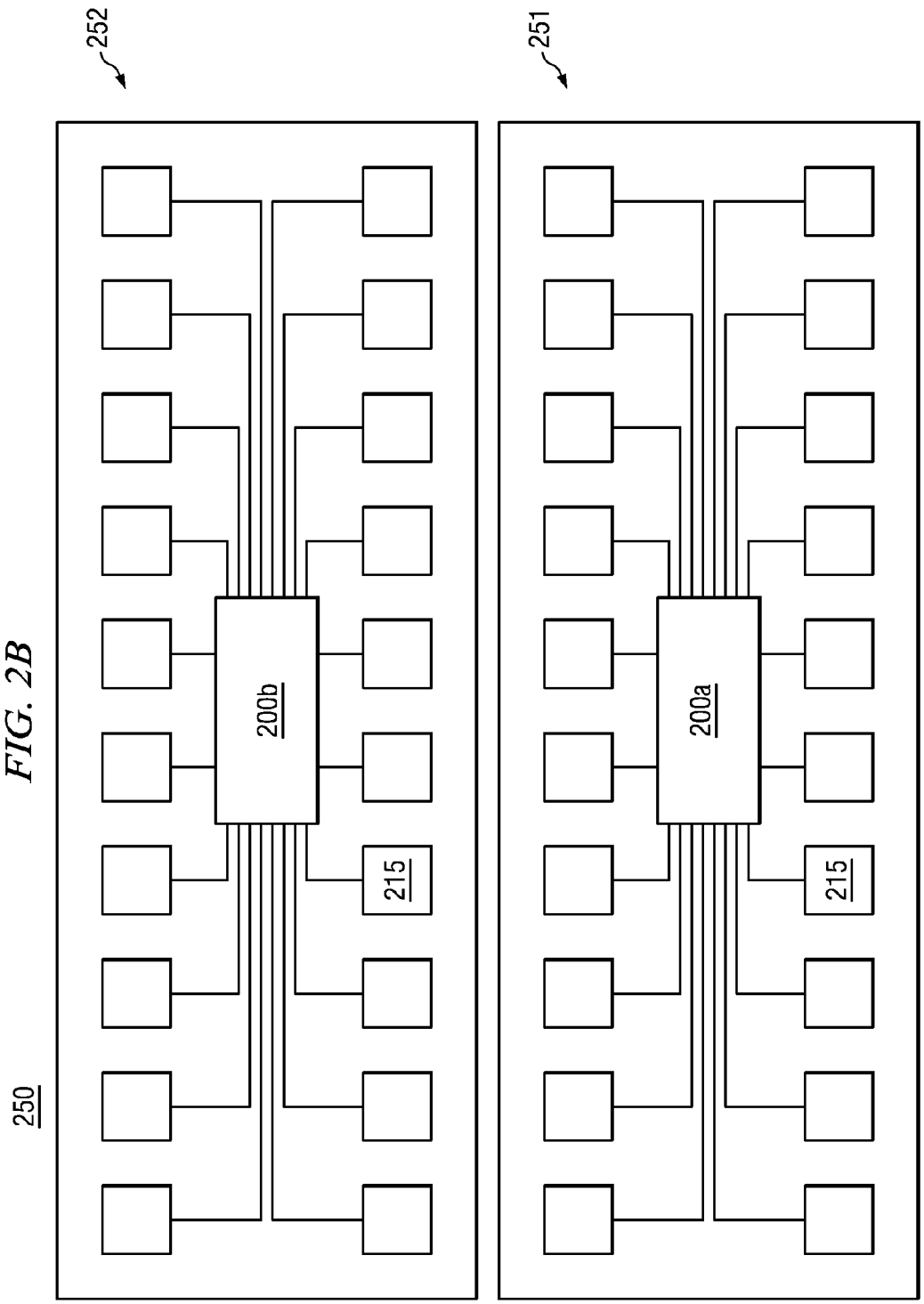

SEMICONDUCTOR WAFER HAVING TEST MODULES INCLUDING PIN MATRIX SELECTABLE TEST DEVICES

FIELD

Embodiments disclosed herein relate to semiconductor wafers and test modules comprising a plurality of test devices on the wafers.

BACKGROUND

As known in the art, a plurality of integrated circuit (IC) chips are formed on a semiconductor wafer by performing semiconductor processing including lithography, etch, ion implant and thin film processes. Following formation of the IC chips, the wafer is sawed for singulation of the chips. The vacant wafer spaces between the IC chips used for sawing the wafer are referred to as scribe line areas.

To assess electrical properties of elements (e.g., MOS transistors) constituting an IC chip, a predetermined pattern of measuring elements or test elements (so-called test modules (TMs)) are generally formed in the scribe line areas of the wafer. The TM is electrically tested by an automatic test system including a probe card, prober system and measurement apparatus, and can be performed after an early metal level (e.g., first metal) and/or after completion of wafer processing, for determining whether circuit elements are suitably formed (e.g., proper threshold voltage and breakdown voltage) in the IC circuit chips formed on the wafer.

Since the TMs are formed using the same process as the process for forming the elements in the IC chips, testing electrical properties of the devices in the TM is identical to testing electrical properties of the elements formed in the IC chips. Accordingly, the properties of the IC chips can be generally be accurately deduced by testing the TM(s).

Process technologies, particularly analog and mixed signal technologies, have significant constraints on both wafer scribe area and scribe test time given the extensive component count and electrical tests needed to properly characterize. A standard 1×16 (1 pin wide, 16 pins long) TM can accommodate up to 4 MOS devices, with 1 pin used for each of the MOS Sources, Gates, Drains, and Substrate/Body terminals. In one arrangement, sharing Gate, Source and Substrate pins globally (i.e. between all devices) in the TM is known, with the Drain pin used to select the particular MOS in the TM for testing. This approach for a standard 1×16 TM increases the number of MOS devices in the TM to 12, so that the number of placed MOS devices approaches the number of test pins.

In another TM arrangement, multiplex circuitry is used to raise the number of placed devices in the TM per pin, to generally achieve more placed devices than number of test pins. However, multiplex circuitry requires dedicated test pins for its implementation (e.g., for circuitry for biasing and indexing) and also has loading effects on the devices during test. It would be desirable to reduce the area of the TM, increase the number of devices in the TM, reduce the number of TMs needed to measure performance, and decrease the test time, without the need for additional circuitry (e.g., such as multiplex circuitry).

SUMMARY

Embodiments described herein include test modules (TMs) and testing methodologies therefrom that include pin matrixed addressing of individual devices in the TM. Such embodiments are enabled by locally shared pins for at least two device terminals for the devices in the TM. Embodiments described herein do not require multiplex circuitry to access specific devices in the TM for testing, but instead use pin matrixed addressing to enable separately accessing individual devices in the TM for testing. Pin matrixed addressing also enables parallel testing (i.e. separately testing multiple MOS devices at the same time) within a TM when used in conjunction with testers having a plurality of Source-Measure Units (SMU's).

As defined herein, "locally shared pins" refers to pins that are coupled to a plurality of like terminals (e.g., Gate, Source or Drain) for a plurality of devices in the TM, but not all the like terminals in the TM. In one arrangement, local pin sharing is along each of the plurality of rows and along each of the plurality of columns in the TM. In contrast, as defined herein, "global pins" refer to pins that are coupled to all like terminals in the TM, and are thus not used for device selection for testing, such as the Body and/or Substrate terminal for MOS devices.

The locally shared pin aspect thus enables addressing and thus selection of specific devices in the TM for testing. Through layout efficiencies enabled by pin matrixed addressing described herein, the number of placed devices in the TMs can be many multiples of the number of test pins. By locally sharing two or more pins, more devices can be placed in a TM saving wafer area while enabling multiple devices to be electrically tested simultaneously (parallel test using testers having a plurality SMU's) which saves test time. Embodiments described herein thus can be used to solve problems related to high component count technology area and test constraints.

BRIEF DESCRIPTION OF THE DRAWINGS

FIG. 2B shows an exemplary TM array comprising a first and a second TM, which can be based on the test circuit shown in FIG. 2A, according to an embodiment of the invention.

DETAILED DESCRIPTION

Figure 1:
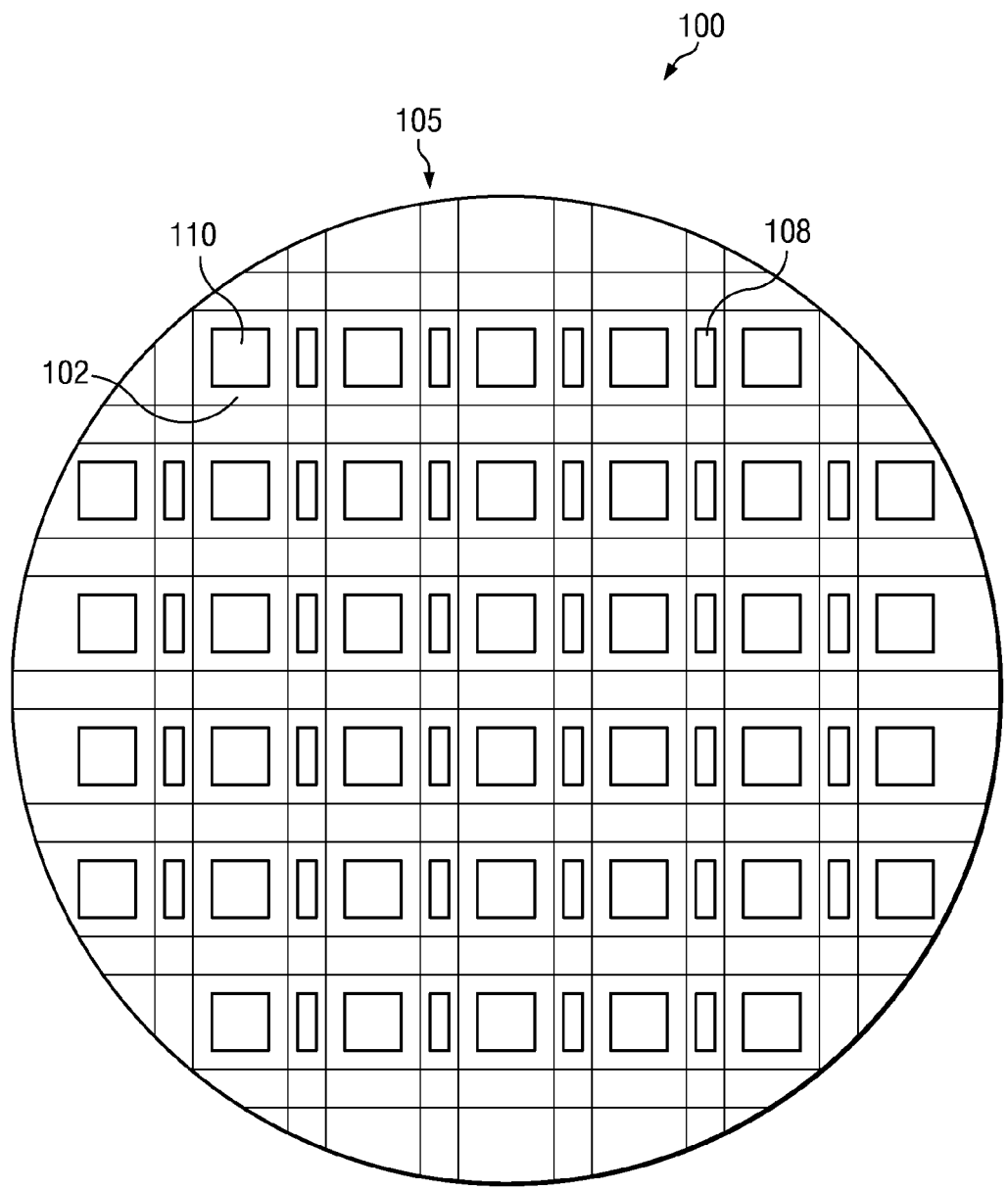
FIG. 1 shows a depiction of a semiconductor wafer including a plurality of die areas having active circuitry comprising a plurality of circuit elements, a plurality of scribe line areas between the plurality of die areas and TMs according to an embodiment of the invention in the scribe line areas.

Embodiments of the invention are described with reference to the attached figures, wherein like reference numerals are used throughout the figures to designate similar or equivalent elements. The figures are not drawn to scale and they are provided merely to illustrate the instant invention. Several aspects are described below with reference to example applications for illustration. It should be understood that numerous specific details, relationships, and methods are set forth to provide a full understanding of embodiments of the invention. One having ordinary skill in the relevant art, however, will readily recognize that embodiments of the invention can be practiced without one or more of the specific details or with other methods. In other instances, well-known structures or operations are not shown in detail to avoid obscuring aspects disclosed herein. Embodiments of the invention are not limited by the illustrated ordering of acts or events, as some acts may occur in different orders and/or concurrently with other acts or events. Furthermore, not all illustrated acts or events are required to implement a methodology in accordance with embodiments of the invention.

Embodiments of the invention describe TMs and TM arrays comprising a plurality of TMs that include locally shared pins for at least two, up to a maximum number set by the total number of terminals, for the devices to be tested in the TM. For example, for three terminal devices, such as bipolar transistors, locally shared pins can be coupled to at least two up to a maximum of all three of the Base, Emitter and Collector terminals. In the case of MOS transistors in the TM, which are generally tested as four terminal (Gate, Source, Drain, Body) or five terminal devices (Gate, Source, Drain, Body, and Substrate), locally shared pins can be coupled to at least two to a maximum of all five (5) (Gate, Source, Drain, Body, and Substrate) terminals. In a typical embodiment for MOS comprising TMs, a global pin biases all Bodies and Substrates, with the Gate, Source, Drain terminals available for locally shared pin connections.

The devices constituting the respective TMs can comprise in one particular example, a PMOS transistor for a logic gate, an NMOS transistor for logic gate, a field NMOS transistor, a field PMOS transistor, a capacitor for a logic gate, a contact chain, and a resistor. NMOS transistors can be disposed in one TM, while PMOS transistors can be disposed in another TM.

FIG. 1 shows a depiction of semiconductor wafer 100 including a plurality of die areas 102 having active circuitry 110 comprising a plurality of circuit elements, a plurality of scribe line areas 105 between the plurality of die areas, and TMs 108 according to an embodiment of the invention in the scribe line areas 105. The active circuitry 110 comprises circuit elements that generally include transistors, diodes, capacitors, and resistors, as well as signal lines and other conductors that interconnect these various circuit elements.

Although shown placed in the scribe lines 105 in FIG. 1, TMs according to embodiments of the invention can be placed in and around the wafer, in some cases replacing die areas 102 that could accommodate active circuitry 110 (referred to as "drop-in" test structures). The TMs 108 have two or more locally shared pins each coupled to different device terminals (e.g., locally shared pins to the Gate and Drain of MOS devices) in the TM 108, with this locally shared pin feature shown in FIGS. 2A and 3 and described below.

Figure 2A:
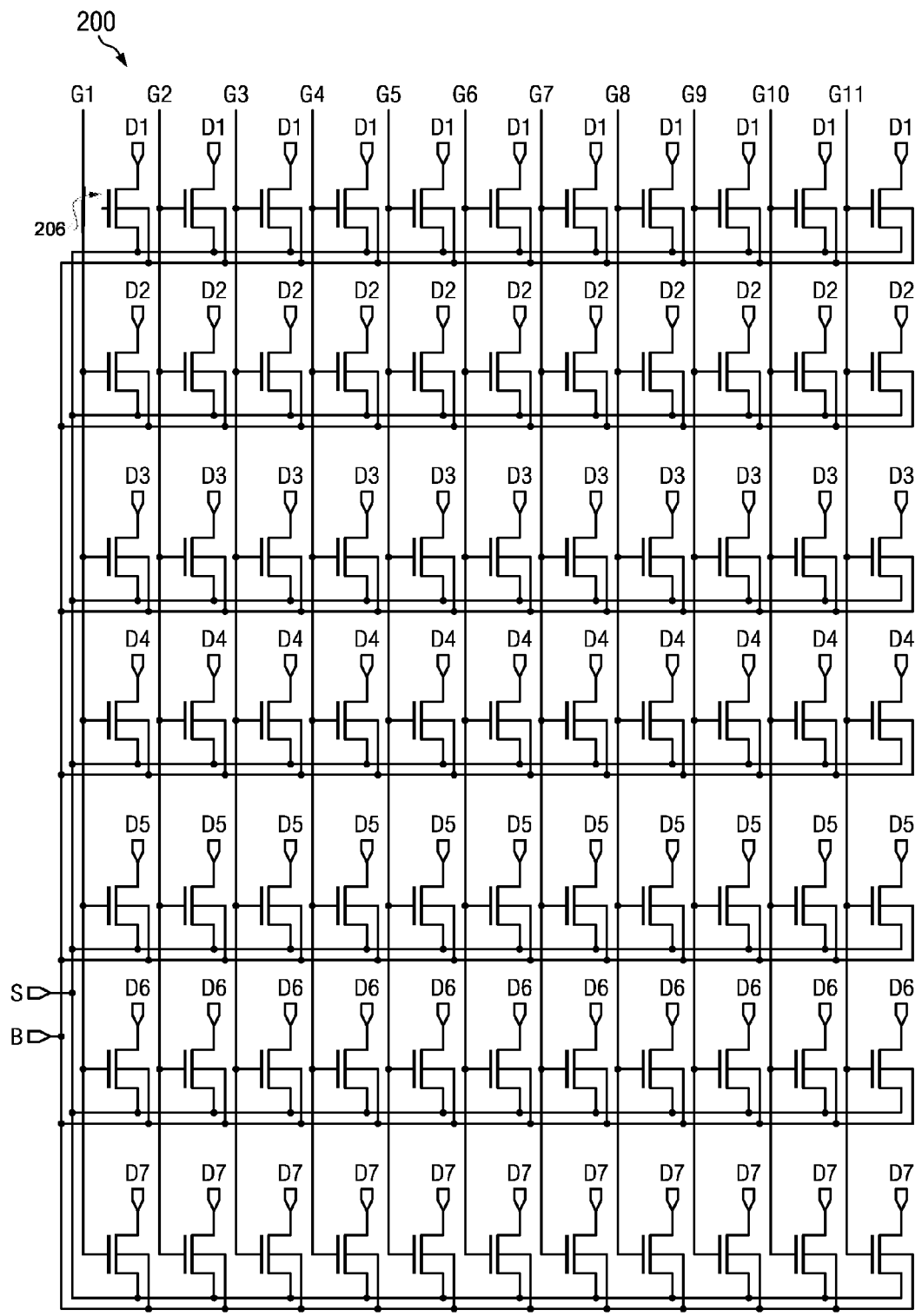
FIG. 2A is a schematic for an exemplary matrix pin test circuit comprising a plurality of MOS transistors arranged in a transistor array, according to an embodiment of the invention.

FIG. 2A is a schematic for an exemplary matrix pin test circuit 200 comprising a plurality of MOS transistors 206 arranged in a transistor array, according to an embodiment of the invention. Test circuit 200 comprises a 7×11 array of MOS transistors 206. Test circuit 200 has locally shared Gate and Drain pins shown as G1 . . . G11 that function as column selects and D1 . . . D7 that function as row selects. The Source (S) and Body (B) are shown as global pins. A pin is terminology commonly used in a schematic and represents a bond pad for the purposes of a test module. Thus, bond pads are represented in the FIGs. as large squares and pins in schematic with flags at ends of wires. Local Drain connections to devices in respective rows of test circuit 200 is provided, but is not shown in FIG. 2A. Test circuit 200 provides the ability for independent access to any one of the 77 transistors 206 shown in FIG. 2A to be addressed and thus selected for test. Those having ordinary skill in the art will recognize that the row and column select terminals may be readily changed from that shown in FIG. 2A.

FIG. 2B shows an exemplary TM array 250 comprising a first and a second 2×10 TM 251 and 252 shown including test circuits 200(a) and TM 200(b), respectively, which can be based on test circuit 200 shown in FIG. 2A. Each of the 20 pins in the respective test circuits are connected to G1 . . . G11, D1 . . . D7, S and B shown in FIG. 2A and are coupled to one of the 20 pads 215 shown in TMs 251 and 252 by metal routing lines 218. The locations of the pads 215 are in standard locations that permit testing with a standard probe card.

Figure 3:
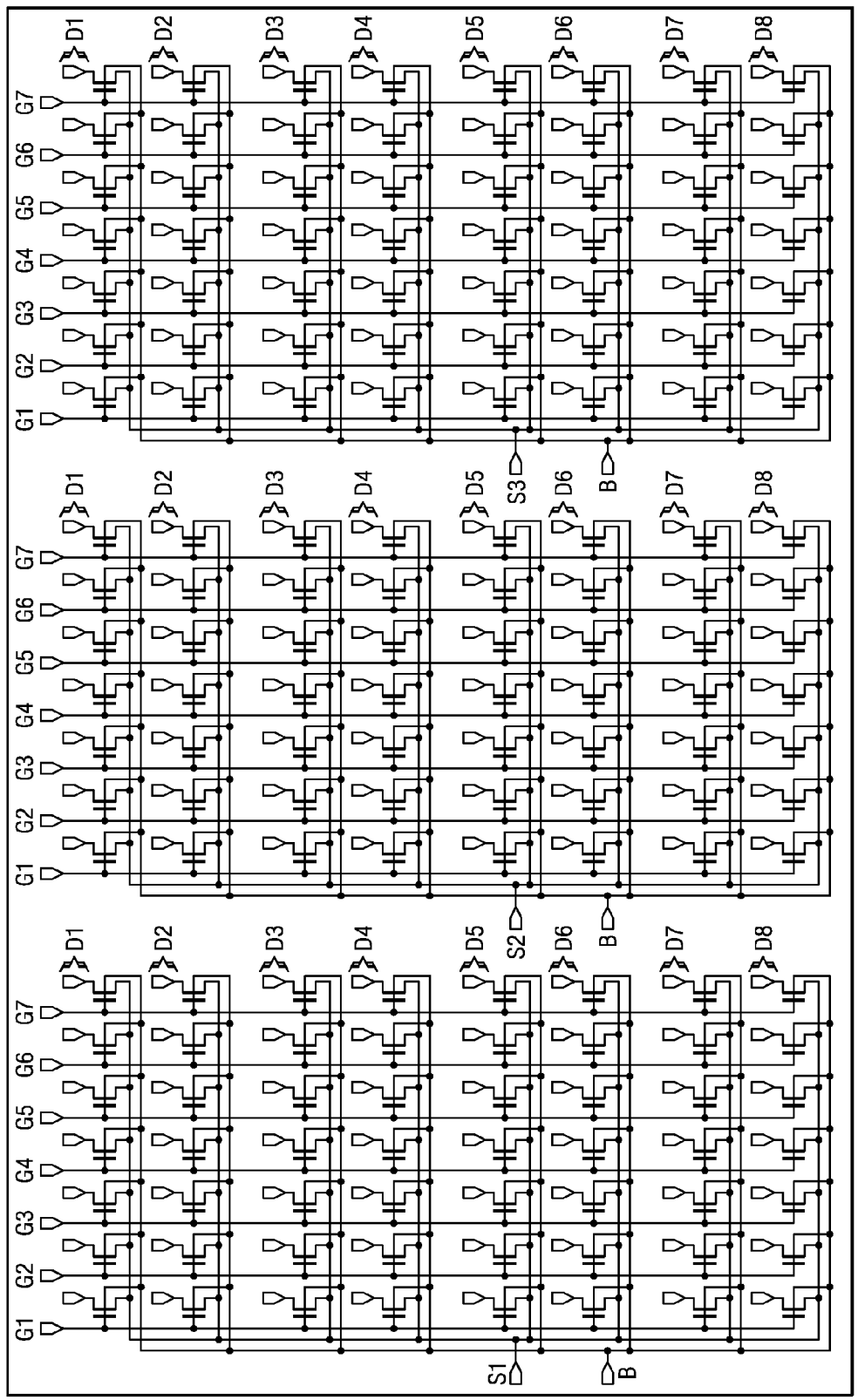
FIG. 3 is a schematic of an exemplary matrix pin test circuit comprising a plurality of MOS transistors arranged into 3 blocks of transistors having locally shared pins for the Gate, Drain and Source terminals, wherein the Source pins provide a block select function, according to an embodiment of the invention.

FIG. 3 is a schematic of an exemplary 20 pin (2×10) MOS-based exemplary matrix pin test circuit 300 arranged into 3 blocks of 56 (7×8) MOS transistors (168 total independently accessible MOS transistors) having locally shared pins for the Gate, Drain and Source terminals, according to an embodiment of the invention. In this arrangement, the 7 Gate pins (G1 . . . G7) function as column selects to select from the 7 columns, while the 8 Drain pins (D1 . . . D8) function as row selects to select from the 8 rows. The 3 Source pins (S1, S2, S3) provide a block select function, selecting between the 3 blocks shown. In process technologies that include wells (e.g. p-well or n-well) diffused into an oppositely doped substrate, there is generally a single global pin provided for the p-well or n-well (Body) and a single global pin for Substrate. Test circuit 300 is shown providing a global pin for the Body and a global pin for Substrate. Those having ordinary skill in the art will recognize that the row, column and block select terminals may be readily changed from that shown in FIG. 3, and for certain process technologies a single global pin can be used for the Source/Body.

Since embodiments disclosed herein involve a minimum of two locally shared pins each coupled to different device terminals, parasitics as well as noise considerations can impose challenges in generating accurate test data. However, as described below, certain TM layout configurations combined with a test plan which mitigates parasitics and noise enables minimizing these undesirable effects.

For MOS-based TMs, the test structures and device geometries (sizes) are typically chosen to correspond to the devices actually used in the ICs that are in the die areas of the wafer. Typically this will include the smallest allowable geometries as well as some larger geometries. For scribe line TM embodiments, given constraints of both available scribe area and scribe tester capabilities, very large structures are uncommon. However added devices in parallel do increase device area and thus leakage levels which scale to area (e.g., active area for the junction leakage).

Regarding leakage measurements (Drain, Source, Gate) and potentially destructive tests (gate dielectric or junction breakdowns), increased leakage levels due to pin matrixing does not generally affect the leakage measurement. This is because leakage scales to area and leakage measurements for mature devices generally are applied to very large geometries to enable a measurable leakage current flow.

Typical measurements for analog components (threshold voltages, conductances, etc.) include biasing at low and moderate stress levels mitigating parallel test concerns. For example, measurement and extraction of MOS threshold voltage, drive current (at typical analog stress levels), and beta factors can be performed at relatively low current levels, and devices in parallel can be selected in a manner avoiding one transistor with many times the current value of another.

Regarding parasitic resistance and resulting debiasing along a metal line, the TM layout can minimize wire resistance voltage drops which could otherwise restrict the number of devices tied to each pin by reducing the parasitic resistance through the geometries and materials of the TM routing. In some applications, depending on specific circumstances of the implementation, to minimize wire resistance voltage drops the number of devices tied to locally shared pins may be less than the maximum number otherwise possible.

Regarding noise, substrate noise is generally a concern, particularly for parallel test. However, the TM layout and materials, as well as the test plan, can be configured to mitigate substrate noise effects in a manner to enable parallel test. One example would include using a plurality of substrate taps along the TM.

Examples below describe 2, 3 and 4 locally shared pin TM arrangements, for MOS-based TMs having 16 pins. It is understood that embodiments disclosed herein are not limited to 16 pin TMs, and can be extended to TMS having more or less pins, such as 20 pin TMs. Moreover, the devices are not limited to MOS devices, and, for example, can be embodied as bipolar, resistor, JFET, Power MOSFET (e.g., LDMOS, DEMOS), capacitor and other devices used in analog mixed signal process technologies.

EXAMPLES

Embodiments of the invention are further illustrated by the following specific Examples, which should not be construed as limiting the scope or content of embodiments of the invention in any way.
2 Locally Shared Pins/2 Pin Device Selection In one arrangement, using global Substrate and Body pins, with one additional global pin selected for connection to the Gate, Drain or Source terminals for the devices in the TM, the remaining 2 terminals are connected as locally shared pins. One of these locally shared pins can select between rows, and one of these locally shared pins can select between columns. In this 3 global pin arrangement, there are 13 pins remaining for use as locally shared pins. Accordingly, allocating 7 pins for local sharing for a first terminal in the TM (e.g., Gate) and 6 pins for local sharing for a second terminal in the TM (e.g., Drain), the TM can include up to 7*6=42 MOS devices that are each independently selectable for testing.

In this arrangement, if a single global pins is used for the Body and the Substrate, or there is no separate Body and Substrate pin (no well diffusion), the TM can include up to 7*7=49 MOS devices that are each independently selectable for testing. During testing, a device under test would have both locally shared pins connected to some potential (ground or hi/lo stress) while the other devices in the TM would have at least one of its locally shared pins as an electrical open (not connected) and thus cannot be biased in an operating state. Other implementations can include biasing device terminals in a manner to reduce or eliminate current flow for special test purposes (e.g. adding extensive back bias to a MOS device.
3 Locally Shared Pins/3 Pin Device Selection In one arrangement, using global Substrate and Body pins, there are 14 pins remaining for use as locally shared pins for Gate, Drain and Source. Accordingly, the maximum number of devices becomes selectable using 5, 5 and 4 pins for local sharing for the respective locally shared pins. In this arrangement, for example, Gate, Drain and Source, 5*5*4=100 MOS devices are each independently selectable for testing, or 5*5*5=125 MOS devices that are each independently selectable if a single global pin is used for the Body and Substrate, or there is no separate Body and Substrate (e.g., no well diffusion). During testing, a device under test would have all 3 locally shared pins connected to some potential (ground or hi/lo stress) while the other devices in the TM would have at least one locally shared pin left open (not electrically connected), or reversed biased, and thus not be conducting any appreciable current.

4 Locally Shared Pins/4 Pin Device Selection

In another arrangement, locally shared pins can be used for the Gate, Drain, Body, and Source. In this arrangement, the selection of a device or a plurality of devices in the TM can be performed through the combination of pins pulled to either high potential or ground planes. One approach for single device testing in this arrangement having a locally shared Body pin comprises applying a backbias (via Body pin) to all devices in the TM except the one of interest thereby severely limiting their current flows (turning these devices off) and thus making the device under test the only device conducting an appreciable current.

As described above, if the tester includes a plurality of SMUs, the testing can comprise parallel testing. For example, typical Keithley 600's have 8 SMU's whereby up to 7 devices can be simultaneously independently measured.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above described embodiments. Rather, the scope of embodiments of the invention should be defined in accordance with the following claims and their equivalents.

Although embodiments of the invention have been illustrated and described with respect to one or more implementations, equivalent alterations and modifications will occur to others skilled in the art upon the reading and understanding of this specification and the annexed drawings. In addition, while a particular feature disclose herein may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A semiconductor wafer comprising:
 a plurality of die areas having active circuitry comprising a plurality of circuit elements;
 a plurality of scribe line areas between said plurality of die areas;

at least one test module (TM) formed in or on said plurality of scribe line areas, each TM including a plurality of test transistors arranged in a plurality of rows and a plurality of columns, each of said plurality of test transistors including at least four terminals comprising a source (S), a drain (D), a gate (G) and a body (B), said TM comprising a plurality of pads, said plurality of pads comprising:
a source pad coupled to the source terminal of each of said plurality of test transistors;
a global body pad coupled to the body terminal of each of said plurality of test transistors;
a plurality of locally shared gate pads, wherein each gate pad is coupled to the gate terminal of all of said plurality of test transistors in a respective one of said plurality of columns;
a plurality of locally shared drain pads, wherein each drain pad is coupled to a drain terminal of all of said plurality of test transistors in a respective one of said plurality of rows.

2. The semiconductor wafer of claim 1, wherein the plurality of test transistors form a first block and wherein at least one TM further comprises at least one second block of test transistors.

3. The semiconductor wafer of claim 2, wherein said source pad is a block select pad.

4. The semiconductor wafer of claim 1, wherein said source pad is a global source pad.

5. A semiconductor wafer comprising:
a plurality of die areas having active circuitry comprising a plurality of circuit elements;
a plurality of scribe line areas between said plurality of die areas;
at least one test module (TM) formed in or on said plurality of scribe line areas, each TM including a plurality of test transistors arranged in a plurality of rows and a plurality of columns, each of said plurality of test transistors including at least four terminals comprising a source (S), a drain (D), a gate (G) and a body (B), said TM comprising a plurality of pads, said plurality of pads comprising:
a first source pad coupled to the source terminal of at least two of said plurality of test transistors;
a global body pad coupled to the body terminal of each of said plurality of test transistors;
a plurality of locally shared gate pads, wherein each gate pad is coupled to the gate terminal of some but not all of said plurality of test transistors;
a plurality of locally shared drain pads, wherein each drain pad is coupled to a drain terminal of some but not all of said plurality of test transistors.

6. The semiconductor wafer of claim 5, wherein said source pad is coupled to at least two of said plurality of test transistors located in different ones of said plurality of rows and at least two of said plurality of test transistors in different ones of said plurality of columns.

7. The semiconductor wafer of claim 5, wherein each of said locally shared gate pads is coupled to the gate terminal of the test transistors in a respective one of said plurality of columns and wherein each of said locally shared drain pads is coupled to a drain terminal of the test transistors in a respective one of said plurality of rows.

8. The semiconductor wafer of claim 5, wherein the TM comprises a plurality of blocks and wherein said plurality of test transistors is a first plurality of test transistors that forms a first one of said blocks.

9. The semiconductor wafer of claim 8, wherein:
a second block of said plurality of block contains a second plurality of test transistors;
the global body pad is coupled to the body terminal of the second plurality of test transistors; and
a second source pad is coupled to the source terminal of the second plurality of test transistors.

10. The semiconductor wafer of claim 5, wherein said TM is exclusive of any logic circuitry for said selecting between said plurality of test transistors for testing.

* * * * *